(12) United States Patent
Behringer et al.

(10) Patent No.: US 12,013,418 B2
(45) Date of Patent: Jun. 18, 2024

(54) MEASURING ASSEMBLY FOR DETECTING A DIRECT CURRENT

(71) Applicant: Siemens Aktiengesellschaft, Munich (DE)

(72) Inventors: Klaus Behringer, Igensdorf (DE); Josef Burger, Schmidgaden (DE); Thomas Baer, Fichtenhof (DE); Annemarie Lehmeier, Ursensollen (DE); Matthias Meier, Poppenricht (DE)

(73) Assignee: Siemens Aktiengesellschaft, Munich (DE)

( * ) Notice: Subject to any disclaimer, the term of this patent is extended or adjusted under 35 U.S.C. 154(b) by 214 days.

(21) Appl. No.: 17/611,721

(22) PCT Filed: May 8, 2020

(86) PCT No.: PCT/EP2020/062806
§ 371 (c)(1),
(2) Date: Nov. 16, 2021

(87) PCT Pub. No.: WO2020/229326
PCT Pub. Date: Nov. 19, 2020

(65) Prior Publication Data
US 2023/0349955 A1    Nov. 2, 2023

(30) Foreign Application Priority Data
May 16, 2019    (EP) .................................. 19174895

(51) Int. Cl.
*G01R 15/20*    (2006.01)
(52) U.S. Cl.
CPC .................. *G01R 15/207* (2013.01)
(58) Field of Classification Search
CPC .................................................. G01R 15/207
See application file for complete search history.

(56) References Cited

U.S. PATENT DOCUMENTS

| | | | |
|---|---|---|---|
| 2005/0156587 A1* | 7/2005 | Yakymyshyn | G01R 15/207 324/117 R |
| 2010/0134093 A1 | 6/2010 | Roellgen | |

(Continued)

FOREIGN PATENT DOCUMENTS

| | | |
|---|---|---|
| CN | 101680917 A | 3/2010 |
| CN | 102012446 A | 4/2011 |

(Continued)

OTHER PUBLICATIONS

Siemens AG, DC Genauigkeit Untersuchung am DCCM In=2×8 Amp, V0.3, May 15, 2018, pp. 1-5.

(Continued)

*Primary Examiner* — Dominic E Hawkins
(74) *Attorney, Agent, or Firm* — Harness, Dickey & Pierce, P.L.C.

(57) ABSTRACT

In accordance with 37 C.F.R. § 1.125, a substitute specification has been included in lieu of substitute paragraphs in connection with the present Preliminary Amendment. The substitute specification is submitted in clean form, attached hereto, and is accompanied by a marked-up version showing the changes made to the original specification. The changes have been made in an effort to place the specification in better form for U.S. practice. No new matter has been added by these changes to the specification. Further, the substitute specification includes paragraph numbers to facilitate amendment practice as requested by the U.S. Patent and Trademark Office.

15 Claims, 8 Drawing Sheets

(56) References Cited

U.S. PATENT DOCUMENTS

| | | | |
|---|---|---|---|
| 2011/0057650 A1 | 3/2011 | Hellwig et al. | |
| 2011/0121827 A1* | 5/2011 | Yakymyshyn | G01R 15/207 |
| | | | 324/251 |
| 2011/0234215 A1* | 9/2011 | Ausserlechner | G01R 33/072 |
| | | | 324/244 |
| 2013/0076343 A1* | 3/2013 | Carpenter | G01R 1/22 |
| | | | 324/252 |
| 2013/0229192 A1 | 9/2013 | Behringer et al. | |
| 2015/0084617 A1 | 3/2015 | Popovic et al. | |
| 2015/0323568 A1 | 11/2015 | Schmitt | |
| 2016/0258985 A1 | 9/2016 | Nomura et al. | |

FOREIGN PATENT DOCUMENTS

| | | |
|---|---|---|
| CN | 104603623 A | 5/2015 |
| DE | 20017512 U1 | 2/2001 |
| DE | 102010043254 A1 | 5/2012 |
| DE | 112015000490 T5 | 11/2016 |
| DE | 102016210970 A1 | 12/2017 |
| WO | WO 2008030129 A2 | 3/2008 |
| WO | WO 2018166995 A1 | 9/2018 |

OTHER PUBLICATIONS

PCT International Examination Report and Written Opinion of International Examination Authority dated May 10, 2021 corresponding to PCT International Application No. PCT/EP2020/062806 filed May 8, 2020.

* cited by examiner

MEASURING ASSEMBLY FOR DETECTING A DIRECT CURRENT

PRIORITY STATEMENT

This application is the national phase under 35 U.S.C. 371 of PCT International Application No. PCT/EP2020/062806 which has an International filing date of May 8, 2020, which designated the United States of America 2020 and which claims priority to European application EP19174895.3 filed May 16, 2019, the entire contents of each of which are hereby incorporated herein by reference.

FIELD

Embodiments of the present invention generally relate to a measuring assembly for detecting a direct electric current flowing in an electrical conductor. The invention further relates to a method for detecting a direct electric current flowing in an electrical conductor.

BACKGROUND

In technical installations, switch cabinets, plug-in units or building automation systems, cables or conductor rails are employed for energy distribution. Growing environmental awareness and rising energy costs necessitate the avoidance of energy wastage and, specifically, dictate the efficient use of electrical energy. As an input variable, the energy management required for this purpose calls for the detailed monitoring of energy distribution. In this regard, energy fluxes to loads which are connected to an electric power supply grid are of particular interest. In order to permit the operation of an energy management system, in particular, it is necessary to detect electric currents flowing in electrical conductors between the power supply grid and the loads.

DE 102010043254 A1 (Siemens AG) of May 3, 2012 discloses a measuring system for monitoring at least one phase of an electrical system, e.g. a load feeder, wherein Hall sensors are employed as current measuring devices. Via a Hall sensor, which employs the Hall effect, direct currents can be measured in a contactless arrangement: in a current measurement of this type, via the Hall sensor, the magnetic flux around an electrical conductor through which a current flows, and which is proportional to the current, is measured. If the control current of the Hall sensor which is arranged in this magnetic field remains constant, the Hall voltage UH generated in the Hall sensor will be proportional to the field strength of the magnetic field, and thus proportional to the conductor current.

SUMMARY

Embodiments of the invention are directed to a measuring assembly for detecting a direct electric current flowing in an electrical conductor; and a method for detecting a direct electric current flowing in an electrical conductor.

At least one embodiment is directed to a measuring assembly for detecting a direct electric current flowing in an electrical conductor, which measuring assembly comprises the electrical conductor, a current measuring unit which incorporates at least two magnetic field sensors for detecting a magnetic field which is generated by the direct electric current, and a filter unit for the homogenization of magnetic fields in the location of the magnetic field sensors which are not generated by the direct electric current.

At least one embodiment of the invention is directed to a method for detecting a direct electric current flowing in an electrical conductor, wherein at least two magnetic field sensors are arranged in the region of a magnetic field which is generated by a direct electric current; wherein external magnetic fields which are not generated by the direct electric current are homogenized at the location of the magnetic field sensors; wherein the magnetic field generated by the direct electric current, and the homogenized magnetic fields which are superimposed thereupon, are detected via the magnetic field sensors; and wherein the strength of the direct electric current is determined from the measurement signals of the magnetic field sensors.

BRIEF DESCRIPTION OF THE DRAWINGS

The above-mentioned properties, features and advantages of the present invention, and the manner in which these are achieved, will be clarified and elucidated in conjunction with the following description of example embodiments, which are described in greater detail with reference to the drawings. Herein, in a schematic representation.

DETAILED DESCRIPTION OF THE EXAMPLE EMBODIMENTS

Figure 1:
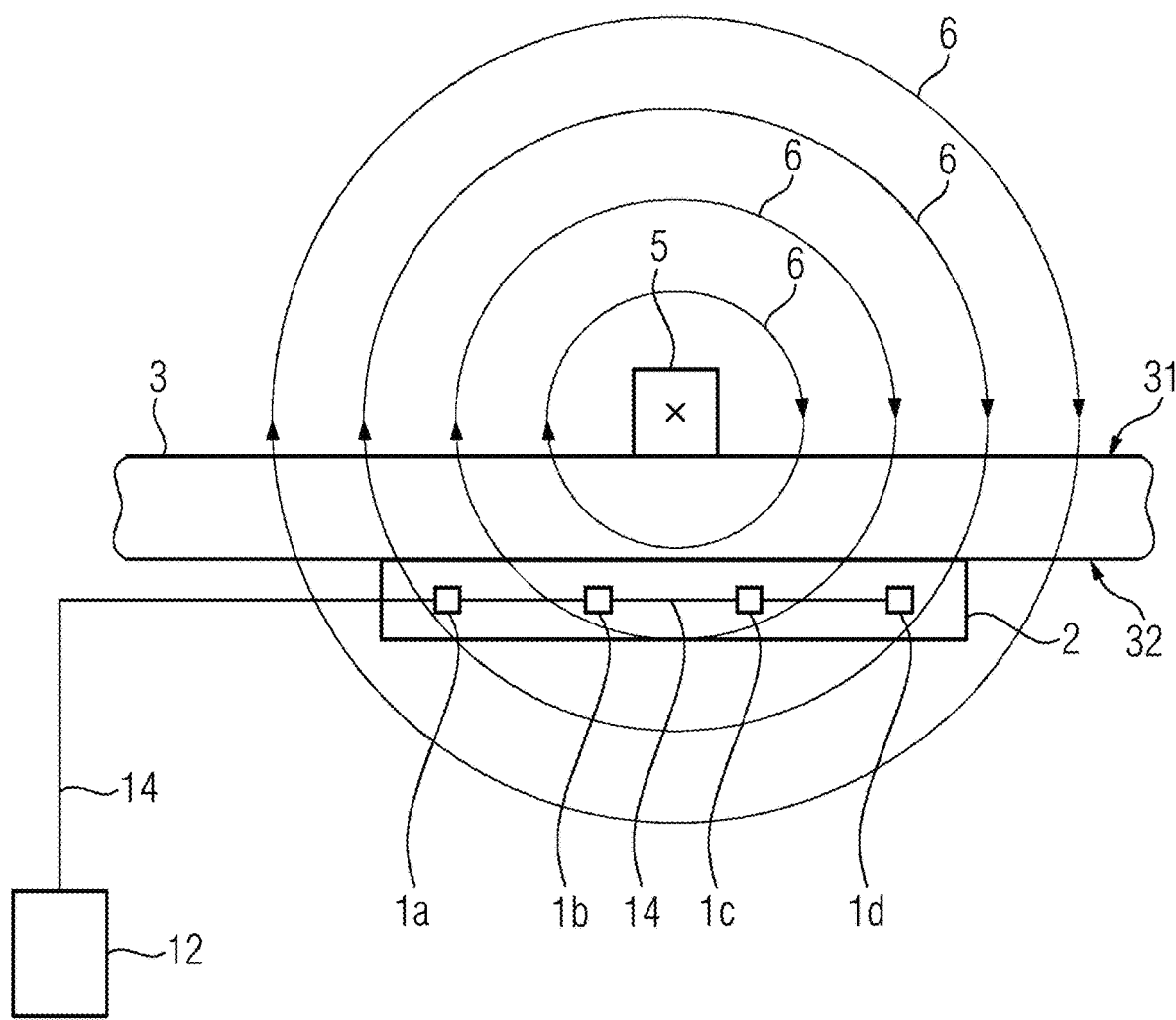
FIG. 1 shows a conventional current measuring unit, in the absence of an external magnetic interference field.

At least one embodiment is directed to a measuring assembly for detecting a direct electric current flowing in an electrical conductor, which measuring assembly comprises the electrical conductor, a current measuring unit which incorporates at least two magnetic field sensors for detecting a magnetic field which is generated by the direct electric current, and a filter unit for the homogenization of magnetic fields in the location of the magnetic field sensors which are not generated by the direct electric current.

The function of the measuring assembly is the detection of a direct electric current flowing in an electrical conductor. A target variable captured via the detection is the current strength I of the direct electric current.

The measuring assembly comprises the electrical conductor, e.g. a power cable, a printed conductor arranged on a circuit board, e.g. a PCB (Printed Circuit Board), or a conductor rail.

The measuring assembly comprises a current measuring unit, which incorporates at least two magnetic field sensors for detecting a magnetic field which is generated by the direct electric current. Any direct electric current generates a sur-rounding magnetic field: in the event of a closed electric circuit, a magnetic field is constituted around an electrical conductor. Here, the magnetic field acts perpendicularly to the current-carrying conductor itself. The field lines are configured in a circular arrangement around the conductor, which constitutes the mid-point of the magnetic field.

Any magnetically sensitive sensor can be employed as a magnetic field sensor, particularly a sensor which operates on the basis of at least one of the following effects: the Hall effect, AMR (anisotropic magnetoresistance effect) or GMR (giant magnetoresistance).

The measuring assembly further comprises a filter unit for the homogenization of external magnetic fields, i.e. magnetic fields which are not generated by the direct electric current flowing in the electrical conductor, at the location of the magnetic field sensors. Homogeneous magnetic fields, in an analogous manner to homogeneous electric fields, assume the property of equal strength and identical orientation at any location. If, between two points in a magnetic field, there is no variation in flux nor any difference in field strength, and in the case of a constant field, all the field lines of which are oriented in parallel in the same direction, this is described as a homogeneous magnetic field.

At least one embodiment of the invention is directed to a method for detecting a direct electric current flowing in an electrical conductor, wherein at least two magnetic field sensors are arranged in the region of a magnetic field which is generated by a direct electric current; wherein external magnetic fields which are not generated by the direct electric current are homogenized at the location of the magnetic field sensors; wherein the magnetic field generated by the direct electric current, and the homogenized magnetic fields which are superimposed thereupon, are detected via the magnetic field sensors; and wherein the strength of the direct electric current is determined from the measurement signals of the magnetic field sensors.

The function of the method is the detection of a direct electric current flowing in an electrical conductor. To this end, at least two magnetic field sensors are arranged in the region of a magnetic field which is generated by the direct electric current. External magnetic fields, which are not generated by the direct electric current, are influenced such that, at the location of the magnetic field sensors, they are present in the form of homogenized magnetic fields. The magnetic field generated by the direct electric current, and the homogenized magnetic fields which are superimposed thereupon, are detected via the magnetic field sensors, Finally, the strength of the direct electric current is determined from the measurement signals of the magnetic field sensors.

At least one embodiment of the invention is based upon knowledge to the effect that it is not possible, with an economically acceptable level of complexity, to entirely displace one or more external magnetic fields from the measuring assembly at the location of the magnetic field sensors. If it were possible to entirely displace the external magnetic field(s) from the measuring assembly at the location of the magnetic field sensors, then a single magnetic field sensor would be sufficient for the detection of a magnetic field generated by the direct electric current, as only one unknown variable would exist in this case: the magnetic field to be measured, which is generated by the direct electric current which flows in the electrical conductor. However, as it is not possible, with an economically acceptable level of complexity, to entirely displace the external magnetic field(s) from the measuring assembly at the location of the magnetic field sensors, the present invention is based upon the maximum possible homogenization of the external magnetic field(s) via the filter unit. As the external magnetic field or fields are not displaced, but are homogenized, two mutually superimposed magnetic fields are present at the location of the magnetic field sensor: (a) the magnetic field to be measured, which is generated by the direct electric current flowing in the electrical conductor, and (b) the external magnetic field or fields, which act as interference fields. Accordingly, as two unknown variables are present, namely, two magnetic fields of different origins, at least two magnetic field sensors are required, in order to permit the magnetic field which is to be measured to be distinguished from the external magnetic fields and detected, e.g. by the derivation thereof from an algorithm in a computer processing unit. Via this arrangement according to the invention, it is achieved that non-uniform external magnetic interference fields, e.g. in the form of circular arcs or otherwise distorted fields, are homogenized at the location of the magnetic field sensors. Conversely to the conventional electric field, the external magnetic interference field is not diverted from, or shielded with respect to the measuring assembly, but is fed through the measuring assembly in this homogenized form.

A non-uniform external magnetic field, at any location in the magnetic field to be measured, i.e. the magnetic field which is generated by the direct electric current flowing in the electrical conductor, delivers a different contribution to the resulting magnetic field which is produced by the superimposition of the external magnetic field and the magnetic field which is to be measured. The magnetic field which is to be measured is thus significantly corrupted, with no option for the simple correction of measured values. Conversely, a homogeneous external magnetic field, at any location in the magnetic field to be measured, delivers an equal contribution to the resulting magnetic field. Thus, at any location in the magnetic field which is to be measured, the external magnetic field generates only a constant offset in the field strength of the magnetic field to be measured. Accordingly, a simple correction of measured values from the magnetic field sensors is possible, wherein the constant offset generated by the external magnetic field is simply deducted from the measured values.

Via the measuring assembly according to at least one embodiment of the invention, it is prevented that, in a current measurement based upon a magnetic field measurement, external magnetic interference fields, i.e. magnetic fields which are not generated by the direct current to be measured, are measured in combination, thereby corrupting the current measurement. External magnetic interference fields are attributable for example, to the magnetic field of the earth, to magnetic fields from permanent magnets which are arranged in the vicinity of the electrical conductor, or to magnetic fields from further electric currents flowing in the vicinity of the electrical conductor. Known shielding concepts from the electrical sector cannot be translated to DC applications, on the grounds that, in DC applications, no diversion to ground is possible (DC=direct current).

The measuring assembly according to at least one embodiment of the invention omits any shielding against external magnetic interference fields via a closed metal housing, as shielding is associated with numerous problems: during the fitting of metal shielding housings, it may be necessary for electrical conductors, boards, printed circuit boards or other device components to be fed through the shielding housing. However, openings weaken the shielding, and sharp edges generate strong fields and can counteract filtering or shielding. In many cases, moreover, in the event of closed housings, compliance with voltage clearances and ESD regulations is not possible. By the omission of solutions which are difficult to execute and structurally complex, the measuring assembly according to the invention obviates all these problems.

Advantageous configurations and further developments of the invention are disclosed in the dependent claims. The method according to the invention can also be further developed in accordance with the dependent claims pertaining to the apparatus, and vice versa.

According to a preferred configuration of at least one embodiment of the invention, the filter unit comprises two filter elements, between which the electrical conductor and the magnetic field sensors are arranged. The filter elements are preferably flat, i.e. planar. If the filter elements were not planar, but instead e.g. were convexly or concavely cambered, the "homogenized" magnetic field between the two filter elements would no longer be completely homogeneous. The filter elements are preferably flat: flat filter elements are structurally the simplest and the most effective. However, it is not necessary for filter elements to be configured here as continuous plates; instead, it is permissible for the filter elements to incorporate bars or voids, in an analogous manner to a Faraday cage.

According to a preferred configuration of at least one embodiment of the invention, the flat filter elements are essentially arranged parallel to one another, in the manner of the plates of a plate-type capacitor. The filter elements thus enclose a cuboid volume, in which the external magnetic field or fields are homogenized.

According to a preferred configuration of at least one embodiment of the invention, the filter elements comprise a ferromagnetic material having a permeability number $\mu r>1$. The filter elements preferably comprise a ferromagnetic material which, at a magnetic field strength H of 1000 A/m, assumes a permeability number $\mu r>1000$. For example, the filter elements are comprised of silicon steel or of M 330-50 A or M 530-50 A electric sheet steel in accordance with DIN EN 10106:2016-03.

According to a preferred configuration of at least one embodiment of the invention, at least one of the filter elements assumes a clearance a from the electrical conductor, and the current measuring unit comprises at least two magnetic field sensors which are arranged adjacently to one another with a clearance b, wherein the clearance a is equal to or greater than the clearance b. The following applies, in principle, to the arrangement of filter elements: I) The greater the clearance of the filter elements from the magnetic field sensors and/or from the electrical conductor, the less the material of the filter elements will be influenced by the magnetic field which is generated by the direct electric current flowing in the electrical conductor. If the clearance a is large, more unwanted fields will be homogenized, and the uninfluenced component of the useful signal, i.e. the magnetic field generated by the direct electric current flowing in the electrical conductor, will be greater. The position of the filter elements must not be arranged symmetrically to the current measuring unit. II) The greater the lateral extension of the filter elements, the lower the "lateral" penetration of magnetic interference fields into the measuring assembly may be. III) The thicker the filter elements, the lower the magnetic saturation thereof. As magnetic saturation is approached, magnetic conductivity declines substantially; consequently, in this application, magnetic saturation is unwanted.

According to a preferred configuration of at least one embodiment of the invention, the current measuring unit is arranged on a printed circuit board. This provides the advantage that further electrical components and electronic components, e.g. communication components for the constitution of a communication interface for the transmission of measuring results, e.g. for transmission to a cloud storage facility, can also be integrated in a simple manner. This provides the further advantage that a compact and modular design of the measuring assembly is facilitated, thereby permitting the saving of both costs and structural space.

According to a preferred configuration of at least one embodiment of the invention, the electrical conductor is arranged on a printed circuit board. This provides the advantage that a compact and modular design of the measuring assembly is facilitated, thereby permitting the saving of both costs and structural space.

According to a preferred configuration of at least one embodiment of the invention, the current measuring unit comprises a computer processing unit, e.g. a processor, which calculates the direct electric current flowing in the electrical conductor from magnetic field signals delivered by the magnetic field sensors. The computer processing unit, the current measuring unit and/or the electrical conductor are preferably arranged on the same printed circuit board. In the event that the magnetic field sensors are configured in the form of Hall effect sensors, magnetic field signals are present in the form of a Hall voltage UH. At each location of the magnetic field to be measured, the homogenized external magnetic field delivers an equal Hall voltage, i.e. there is a constant offset in the Hall voltages, which generates the magnetic field to be measured. Accordingly, a simple correction of the Hall voltages measured by the magnetic field sensors is possible, wherein the constant Hall voltage, which originates from the homogenized external magnetic field, is simply deducted from the Hall voltages, which are measured by the magnetic field sensors as a superimposition of the magnetic field to be measured and the homogenized external magnetic field. This can be achieved in a simple manner if the magnetic field sensors, in relation to the magnetic field to be measured, are arranged symmetrically, such that the Hall voltage assumes both positive and negative values.

FIG. 1 shows a sectional view of a straight-line electrical conductor 5 which is arranged on a first surface 31 of a printed circuit board 3, in the form of a conductor rail of quadratic cross section, along the longitudinal axis of which a direct electric current flows, generated by a potential difference which is applied to the electrical conductor 5. The technical current direction, i.e. from the positive electrical pole to the negative electrical pole, is oriented inwardly to the drawing plane, such that the direction of rotation of the field lines 6 of the magnetic field which is generated by the current flux, in accordance with the corkscrew rule, is a clockwise direction.

On a second surface 32 of the printed circuit board 3 which, with respect to the printed circuit board 3, is arranged in opposition to the first surface 31, a current measuring module 2 is arranged, which comprises four Hall effect sensors 1a to 1d, arranged in a row transversely to the electrical conductor 5, by way of magnetic field sensors. These Hall effect sensors 1a to 1d detect the Hall voltage UH which is present in the Hall effect sensor, which is proportional to the field strength of the magnetic field, and thus proportional to the conductor current, and transmit these voltage values via a signal line 14 to a computer processing unit 12, where the strength of the direct electric current flowing in the electrical conductor 5 is calculated from the collected voltage values.

Figure 2:
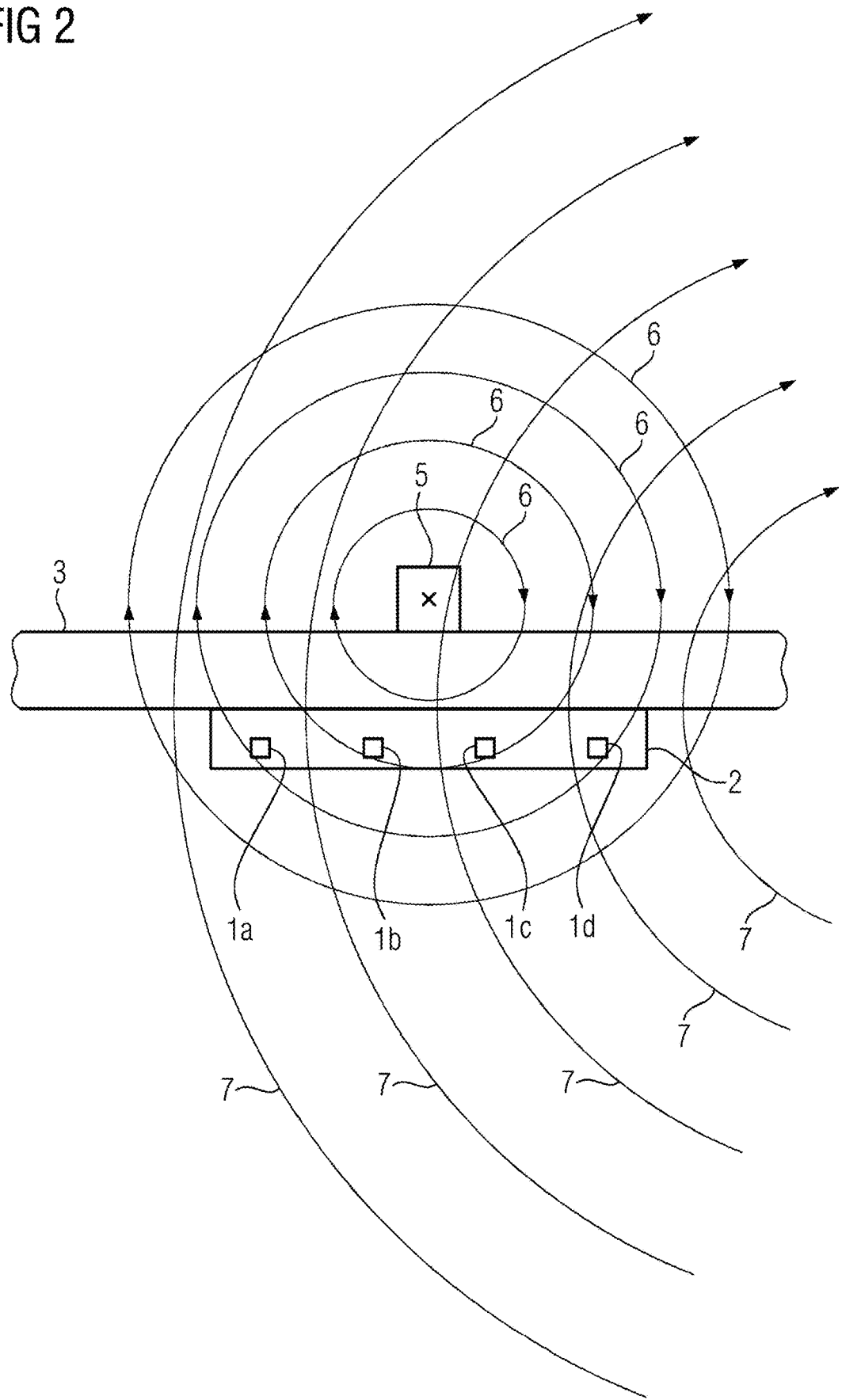
FIG. 2 shows a conventional current measuring unit, in the presence of an external magnetic interference field.

FIG. 2, on the basis of FIG. 1, represents the case in which an external and non-uniform magnetic field 7, which is e.g. the magnetic field of the earth, or the magnetic field of a permanent magnet, or which is generated by an unrepresented further current-carrying conductor, is superimposed upon the magnetic field 6 which is generated by the current flux. As the non-uniformity of the external magnetic field 7, which is superimposed upon the magnetic field 6 to be measured, i.e. the useful signal, is not known, as is the case in practice, it is not possible for the strength of the magnetic field 6 which is to be measured to be determined in isolation. Accordingly, a correct indication of the strength of the direct electric current flowing in the electrical conductor 5 is not possible.

Figure 3:
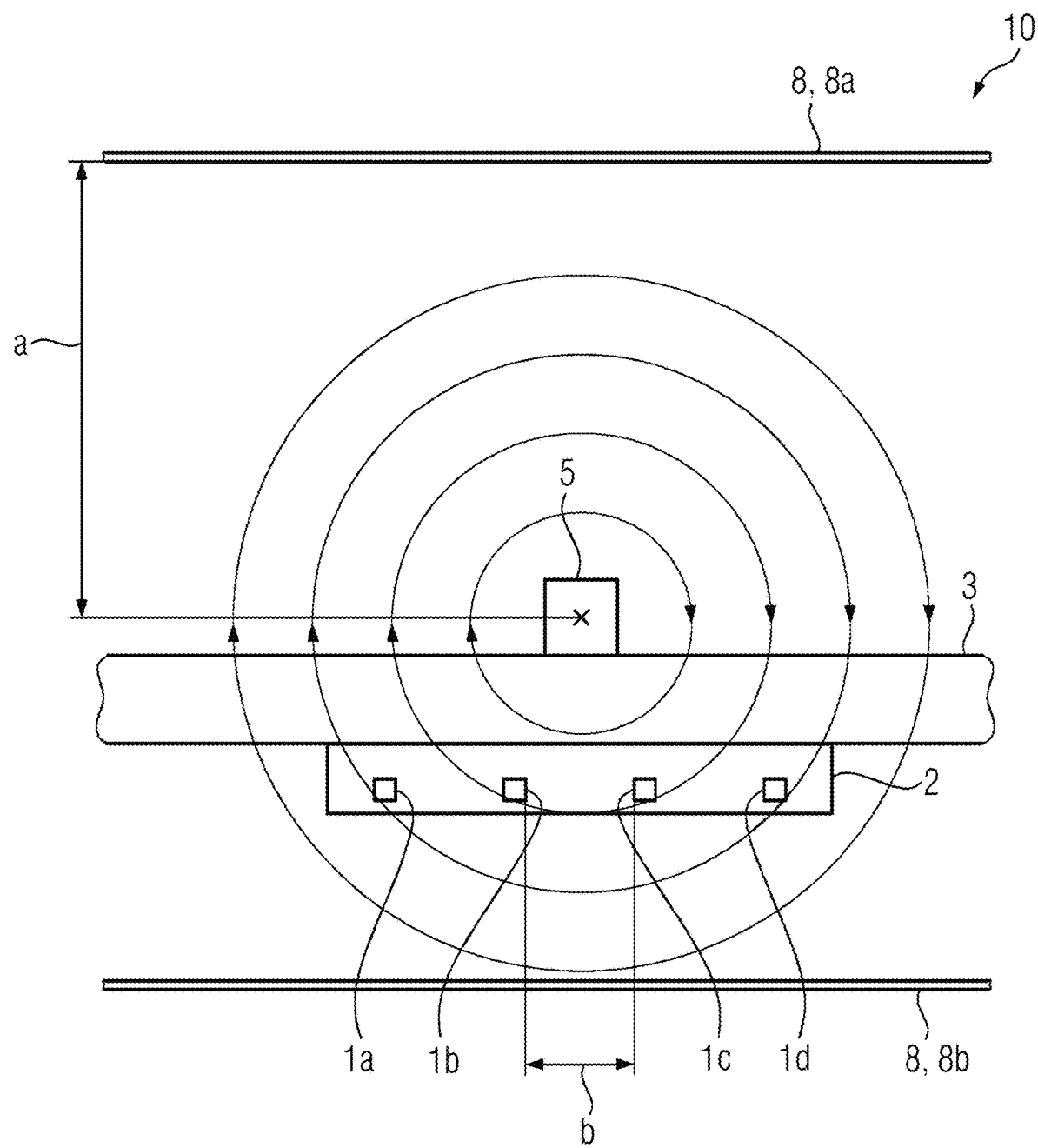
FIG. 3 shows a measuring assembly according to an embodiment of the invention, in the absence of an external magnetic interference field.

FIG. 3, on the basis of FIG. 1, represents a measuring assembly according to an embodiment of the invention. In the interests of simplification, representation of the signal line 14 and the computer processing unit 12 has been omitted. Conversely to the assembly represented in FIG. 1, the measuring assembly according to the invention represented in FIG. 3 comprises a filter unit 8 for the homogenization of magnetic fields which are not generated by the direct electric current in the electrical conductor 5 at the location of the magnetic field sensors 1a, 1b, 1c, 1d. The filter unit 8 is constituted by two plate-type filter elements 8a and 8b, which are essentially arranged parallel to one another, between which the electrical conductor 5 and the magnetic field sensors 1a, 1b, 1c, 1d are arranged. One of the filter elements 8a assumes a clearance a from the electrical conductor 5. Two adjoining magnetic field sensors 1b, 1c assume a mutual clearance b from one another, wherein clearance a is greater than clearance b.

Figure 4:
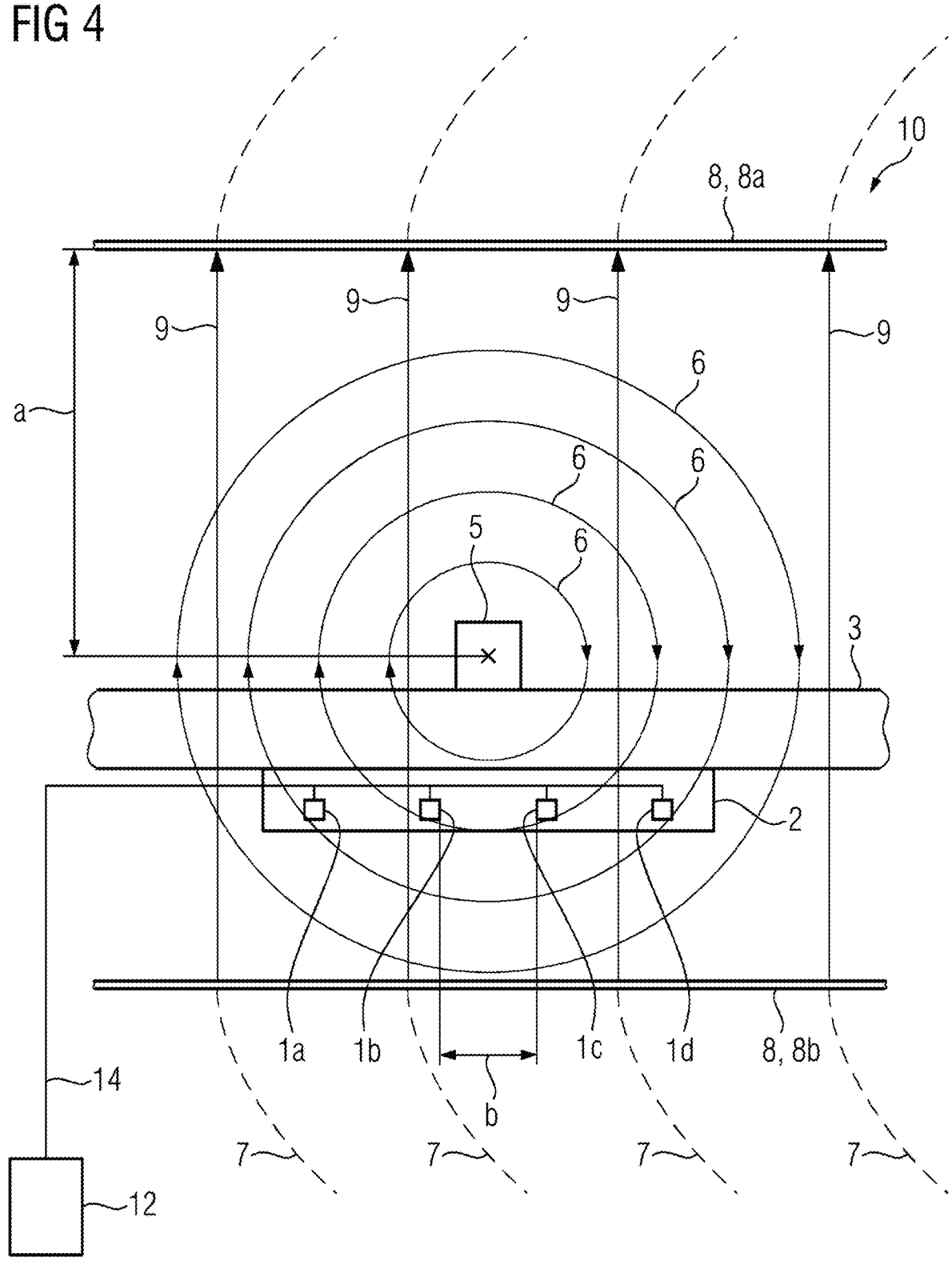
FIG. 4 shows a measuring assembly according to an embodiment of the invention, in the presence of an external magnetic interference field.

FIG. 4, on the basis of FIG. 3, represents the case in which an external and non-uniform magnetic field 7, which is, for example, the magnetic field of the earth or the magnetic field of a permanent magnet, or which is generated by a further and unrepresented current-carrying conductor, is superimposed upon the magnetic field 6 which is generated by the current flux. As a result of the filter unit, the external magnetic field 7, between the two plate-type filter elements 8, shows homogeneous, i.e. parallel-oriented, magnetic field lines 9 of equal magnetic field strength, i.e. the external magnetic field 7 is homogenized between the two plate-type filter elements 8.

As a result of the homogenization 9, between the two plate-type filter elements 8, of the external magnetic field, which is superimposed upon the magnetic field 6 to be measured, i.e. the useful signal, it is now possible, via an algorithm installed in the computer processing unit 12, to determine the strength of the magnetic field 6 to be measured solely on the basis of signals from the magnetic field sensors 1a, 1b, 1c, 1d. An accurate indication of the strength of the direct electric current flowing in the electrical conductor 5 is thus possible, wherein this indication is not corrupted by the external magnetic field.

Figure 5:
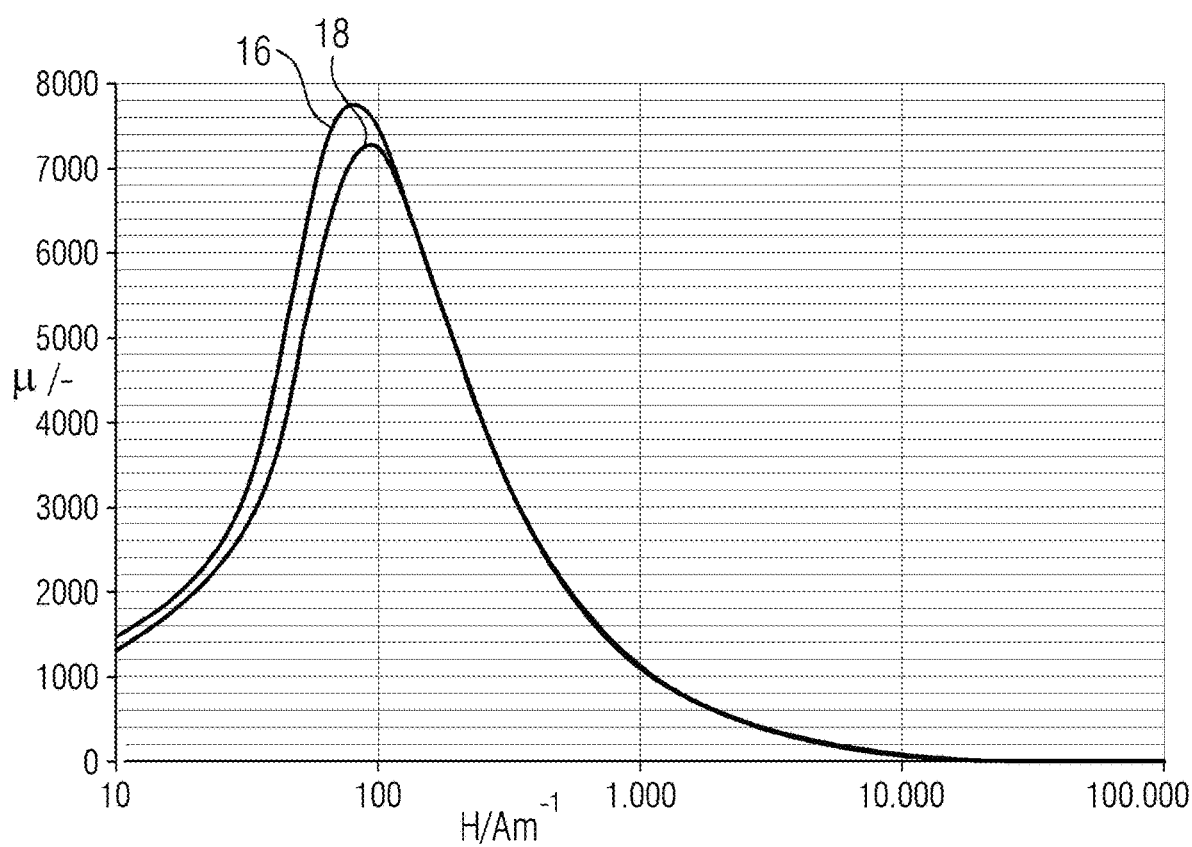
FIG. 5 shows the characteristics of permeability numbers for appropriate example ferromagnetic materials for plate-type filter elements.

FIG. 5, in a H-$\mu_r$-diagram with the magnetic field strength H in units A/m plotted on the x-axis, and the dimensionless permeability number $\mu_r$ plotted on the y-axis, shows the characteristics 16, 18 of permeability numbers $\mu_r$, according to the magnetic field strength H, for two example ferromagnetic materials which are appropriate for plate-type filter elements, namely, the characteristic 16 of the permeability number $\mu_r$ for M 330-50 A electric sheet steel, and the characteristic 18 of the permeability number μr for M 530-50 A electric sheet steel, of respective sheet thickness 0.50 mm. The characteristic of the permeability number μr is approximately equivalent for both materials: up to a magnetic field strength H in the region of 80/100 A/m, the permeability number rises, achieves a maximum value at 80/100 A/m, and declines constantly thereafter. These two materials have been selected on the grounds that, at a magnetic field strength H of 1000 A/m, they continue to show a permeability number μr>1000.

Both types of electric sheet steel are to be understood as examples of appropriate materials only, and not by way of limitation; further ferromagnetic materials can also be employed for the production of filter elements.

Figure 6:
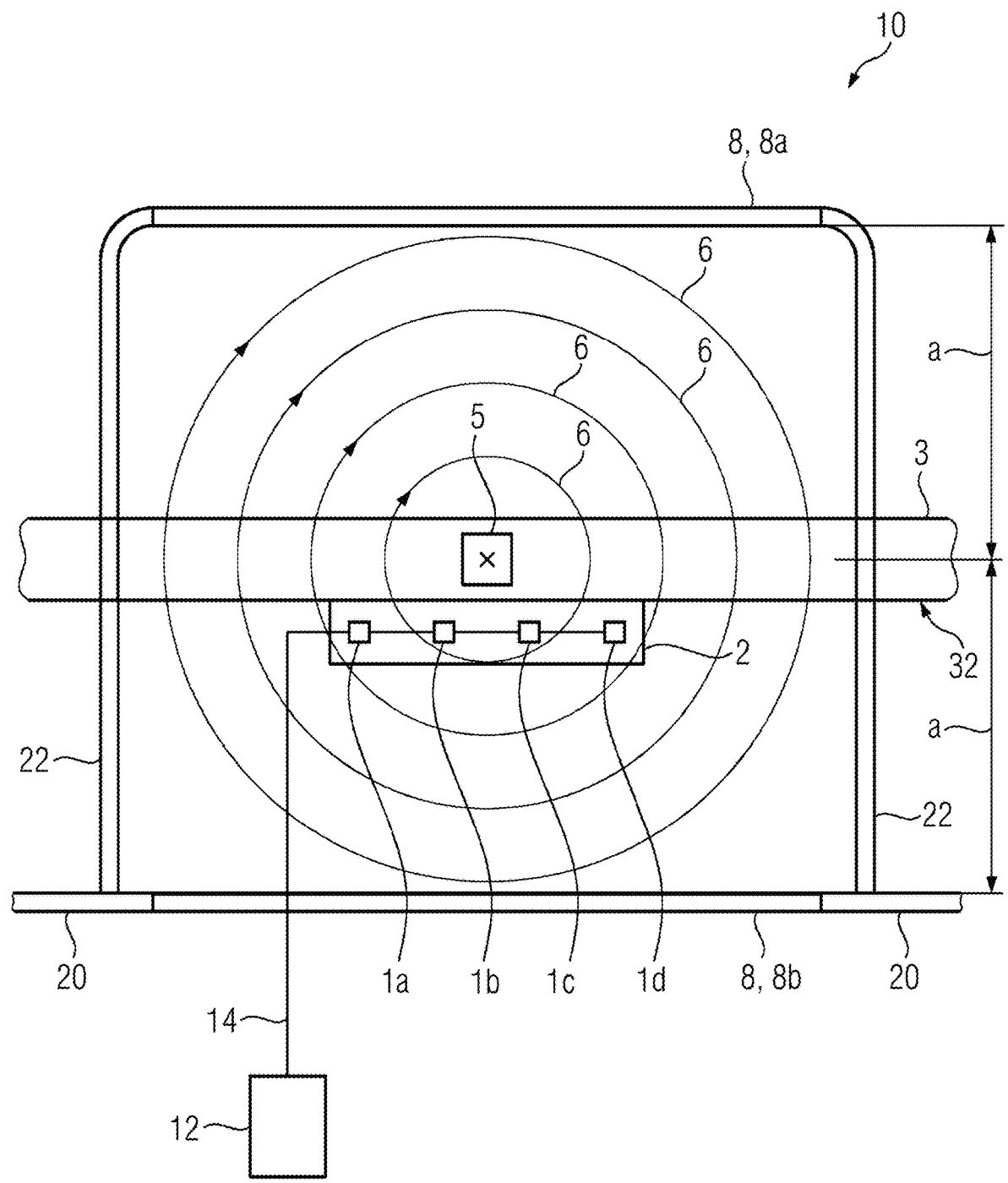
FIG. 6 shows a further embodiment of a measuring assembly according to an embodiment of the invention.

FIG. 6 shows a sectional view of a further embodiment of a measuring assembly according to the invention. Within a printed circuit board 3, a straight-line electrical conductor 5 of quadratic cross section is arranged, along the longitudinal axis of which a direct electric current flows, generated by a potential difference which is applied to the electrical conductor 5. The technical current direction, i.e. from the positive electrical pole to the negative electrical pole, is oriented inwardly to the drawing plane, such that the direction of rotation of the field lines 6 of the magnetic field which is generated by the current flux, in accordance with the corkscrew rule, is a clockwise direction.

On one surface 32 of the printed circuit board 3, a current measuring module 2 is arranged, which comprises four Hall effect sensors 1a to 1d, arranged in a row transversely to the electrical conductor 5, by way of magnetic field sensors. These Hall effect sensors 1a to 1d detect the Hall voltage UH which is present in the Hall effect sensor, which is proportional to the field strength of the magnetic field, and thus proportional to the conductor current, and transmit these voltage values via a signal line 14 to a computer processing unit 12, where the strength of the direct electric current flowing in the electrical conductor 5 is calculated from the collected voltage values.

The measuring assembly 10 comprises a filter unit 8 for the homogenization of magnetic fields which are not generated by the direct electric current in the electrical conductor 5, at the location of the magnetic field sensors 1a, 1b, 1c, 1d. The filter unit 8 comprises two plate-type filter elements 8a and 8b, which are arranged on opposing sides of the electrical conductor 5 and the magnetic field sensors 1a, 1b, 1c, 1d. A first filter element 8a is maintained in position by a first supporting element 22, which is braced against the printed circuit board 3 and is fastened to the printed circuit board 3, at a clearance a from the electrical conductor 5. A second filter element 8b is maintained in position by a second supporting element 20, which is connected to the first supporting element 22, at a clearance a from the electrical conductor 5. In this manner, the two filter elements 8a, 8b are arranged in a fixed and defined position, relative to one another and relative to the printed circuit board 3, and thus, additionally, in relation to the electrical conductor 5 and the current measuring module 2.

Figure 7:
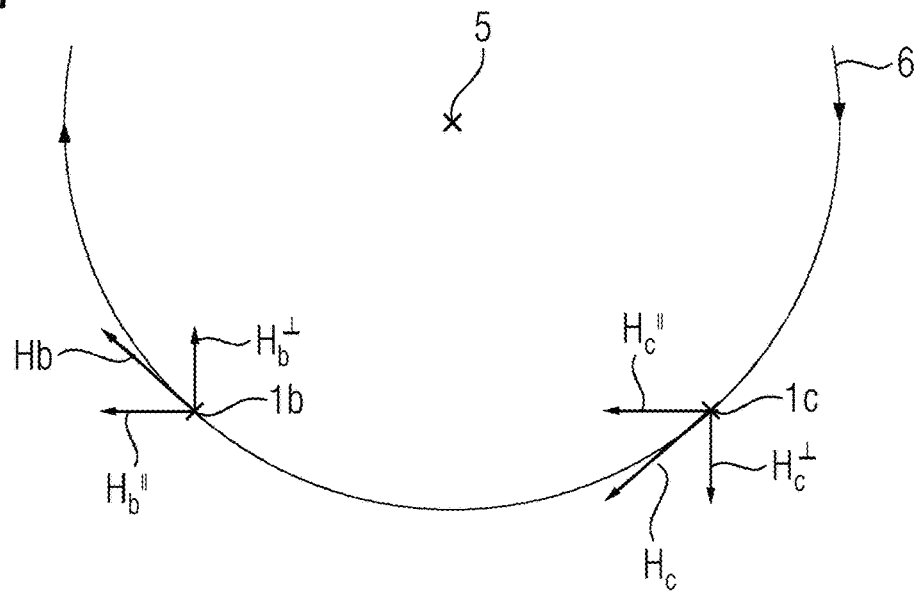
FIG. 7 shows a magnetic field to be measured, which is generated by a conductor through which a current flows.
Figure 8:
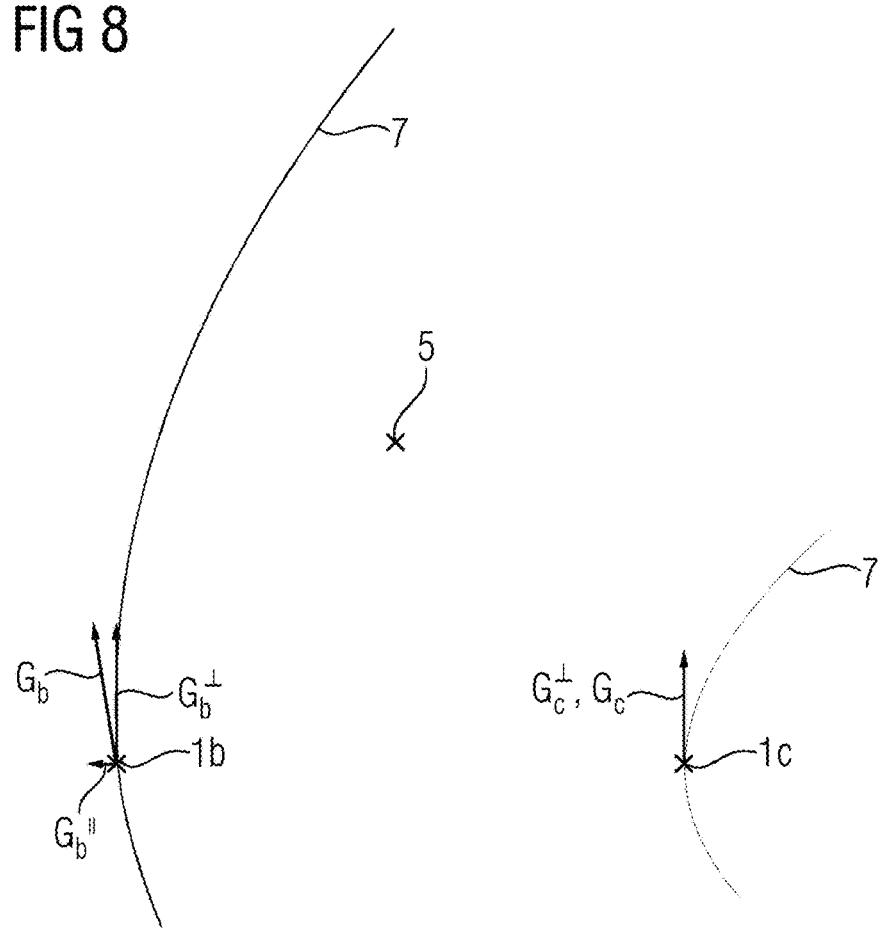
FIG. 8 shows an external non-uniform magnetic field.
Figure 9:
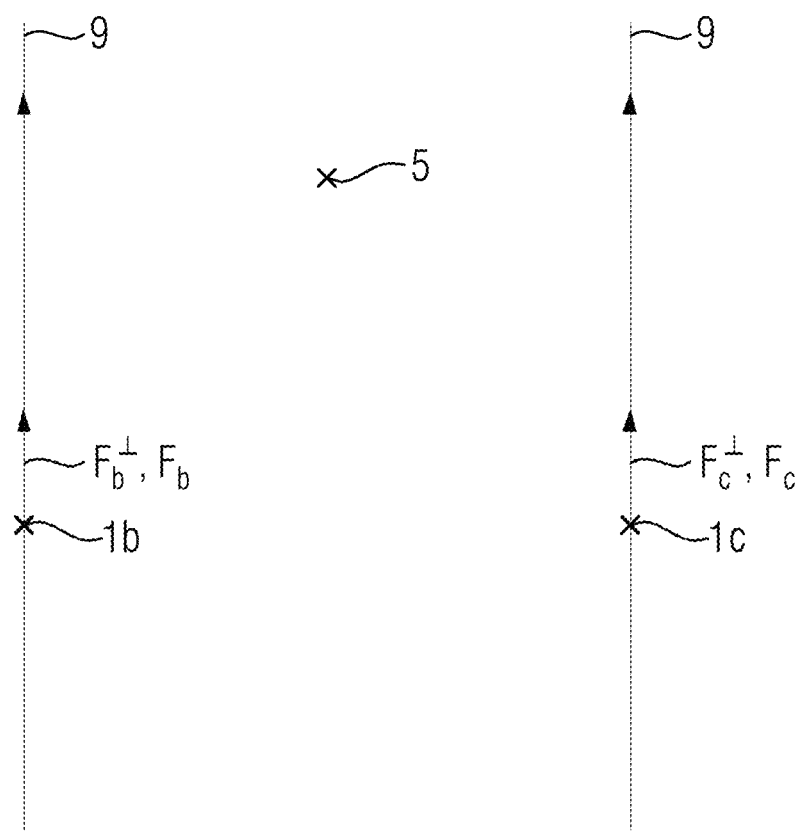
FIG. 9 shows an external magnetic field which is homogenized by a filter unit.

FIGS. 7 to 9 illustrate the homogenizing effect of the filter unit, with respect to the breakdown of the magnetic field strength into subcomponents.

FIG. 7 shows a magnetic field 6 to be measured, which is generated by a current-carrying conductor 5. The Hall effect sensors arranged at positions 1b and 1c are oriented such that, at a magnetic field strength, indicated by H, of the magnetic field 6, they only execute a measurement in a transverse direction indicated by ⊥. The Hall effect sensor arranged at a first position 1b measures only the transverse component $H_b^\perp$ of the magnetic field strength $H_b$ which is present at the first position 1b, whereas the parallel component $H_b^{\parallel}$ does not contribute to the signal of the Hall effect sensor. The Hall effect sensor arranged at a second position 1c measures only the transverse component $H_c^{\perp}$ of the magnetic field strength $H_c$ which is present at the second position 1c, whereas the parallel component $H_c^{\parallel}$ does not contribute to the signal of the Hall effect sensor. It should be observed that, as a result of the symmetrical positioning of the two Hall effect sensors in relation to the current-carrying electrical conductor 5, the first transverse component $H_b^{\perp}$ and the second transverse component $H_c^{\perp}$ carry different symbols.

FIG. 8 shows an external and non-uniform magnetic field 7, which is not generated by the current-carrying conductor 5, but is generated e.g. by a permanent magnet. The Hall effect sensors arranged at positions 1b and 1c are oriented such that, at a magnetic field strength, indicated by G, of the magnetic field 7, they only execute a measurement in a transverse direction indicated by $\perp$. The Hall effect sensor arranged at a first position 1b measures only the transverse component $G_b^{\perp}$ of the magnetic field strength $G_b$ which is present at the first position 1b, whereas the parallel component $G_b^{\parallel}$ does not contribute to the signal of the Hall effect sensor. The Hall effect sensor arranged at a second position 1c measures only the transverse component $G_c^{\perp}$ of the magnetic field strength $G_c$ which is present at the second position 1c and which, as a result of the characteristic of the magnetic field 7, is identical to the magnetic field strength $G_c$.

FIG. 9 shows an external and homogenized magnetic field 9, which is produced by a filter unit from the non-uniform magnetic field 7 represented in FIG. 8. The Hall effect sensors arranged at positions 1b and 1c are oriented such that they only execute a measurement of the magnetic field strength, indicated by F, of the magnetic field 9 in a transverse direction indicated by $\perp$. The Hall effect sensor arranged at a first position 1b measures only the transverse component $F_b^{\perp}$ of the magnetic field strength $F_b$ which is present at the first position 1b and which, as a result of the characteristic of the magnetic field 9, is identical to the magnetic field strength $F_b$. The Hall effect sensor arranged at a second position 1c measures only the transverse component $F_c^{\perp}$ of the magnetic field strength $F_c$ which is present at the second position 1c and which, as a result of the characteristic of the magnetic field 9, is identical to the magnetic field strength $F_c$.

It should be observed that, as a result of the homogeneity of the magnetic field 9, the two transverse components $F_b^{\perp}$ and $F_c^{\perp}$ are of equal magnitude. Signals from the Hall effect sensors at positions 1b, 1c resulting from the superimposition of the transverse components of the two field strengths H and F can thus undergo a simple clean-up, by the application of the constant component $F_b^{\perp}=F_c^{\perp}$ from the homogenized magnetic field 9, in order to obtain values for the actual magnetic field 6 to be measured, which is generated by the current flux in the electrical conductor 5.

The invention claimed is:

1. A measuring assembly for detecting a direct electric current flowing in an electrical conductor, the measuring assembly comprising:
   the electrical conductor;
   a current measuring unit including at least two magnetic field sensors configured to detect a magnetic field generated by the direct electric current; and
   a filter unit configured to homogenize magnetic fields not generated by the direct electric current in a location of the at least two magnetic field sensors.

2. The measuring of claim 1, wherein the filter unit includes two flat filter elements, and
   the electrical conductor and the magnetic field sensors are between the two flat filter elements.

3. The measuring assembly of claim 2, wherein the two flat filter elements include a ferromagnetic material having a permeability number μr>1.

4. The measuring assembly of claim 3, wherein
   at least one of the two flat filter elements is a first distance from the electrical conductor,
   the current measuring unit includes at least two magnetic field sensors adjacent at a second distance to one another, and
   the first distance is equal to or greater than the second distance.

5. The measuring assembly of claim 3, wherein the current measuring unit is on a printed circuit board.

6. The measuring assembly of claim 3, wherein the electrical conductor is on a printed circuit board.

7. The measuring assembly of claim 3, wherein the current measuring unit includes at least one processor configured to calculate the direct electric current flowing in the electrical conductor from signals delivered by the at least two magnetic field sensors.

8. The measuring assembly of claim 2, wherein
   at least one of the two flat filter elements is a first distance from the electrical conductor,
   the current measuring unit includes at least two magnetic field sensors adjacent at a second distance to one another, and
   the first distance is equal to or greater than the second distance.

9. The measuring assembly of claim 2, wherein the current measuring unit is on a printed circuit board.

10. The measuring assembly of claim 2, wherein the electrical conductor is on a printed circuit board.

11. The measuring assembly of claim 2, wherein the current measuring unit includes at least one processor configured to calculate the direct electric current flowing in the electrical conductor from signals delivered by the at least two magnetic field sensors.

12. The measuring assembly of claim 1, wherein the current measuring unit is on a printed circuit board.

13. The measuring assembly of claim 1, wherein the electrical conductor is on a printed circuit board.

14. The measuring assembly of claim 1, wherein the current measuring unit includes at least one processor configured to calculate the direct electric current flowing in the electrical conductor from signals delivered by the at least two magnetic field sensors.

15. A method for detecting a direct electric current flowing in an electrical conductor, at least two magnetic field sensors being arranged in region of a magnetic field generated by the direct electric current, the method comprising:
   homogenizing external magnetic fields not generated by the direct electric current, at a location of the magnetic field sensors, to form homogenized magnetic fields;
   detecting the magnetic field generated by the direct electric current, and the homogenized magnetic fields superimposed upon the magnetic field generated by the direct electric current, via the at least two magnetic field sensors; and
   determining a strength of the direct electric current from measurement signals of the at least two magnetic field sensors.

* * * * *